United States Patent [19]

Utaka et al.

[11] Patent Number: 4,573,158
[45] Date of Patent: Feb. 25, 1986

[54] DISTRIBUTED FEEDBACK SEMICONDUCTOR LASER

[75] Inventors: Katsuyuki Utaka, Musashino; Kazuo Sakai; Shigeyuki Akiba, both of Tokyo, all of Japan

[73] Assignee: Kokusai Denshin Denwa Kabushiki Kaisha, Tokyo, Japan

[21] Appl. No.: 699,586

[22] Filed: Feb. 8, 1985

Related U.S. Application Data

[63] Continuation of Ser. No. 410,431, Aug. 23, 1982, abandoned.

[30] Foreign Application Priority Data

Aug. 27, 1981 [JP] Japan ................................ 56-133280

[51] Int. Cl.⁴ ............................................... H01S 3/19
[52] U.S. Cl. ........................................ 372/32; 372/50; 372/96
[58] Field of Search ...................... 372/45, 46, 50, 96, 372/29, 32, 26; 357/17; 330/4.3

[56] References Cited

U.S. PATENT DOCUMENTS 3,524,146 8/1970 Mohn ..................................... 372/92
4,360,921 11/1982 Scifres et al. ........................ 372/50

Primary Examiner—James W. Davie
Attorney, Agent, or Firm—Robert E. Burns; Emmanuel J. Lobato; Bruce L. Adams

[57] ABSTRACT

A semiconductor laser of distributed feedback type, which is provided with a portion having periodic refractive index variations in the direction of light propagation in one of an active layer and a layer adjacent thereto and is caused to perform laser oscillation by injecting a current into the active layer portion. In accordance with the present invention, a current injection region having no periodic refractive index variations is formed on an extension of the portion having the periodic refractive index variations.

4 Claims, 6 Drawing Figures

DISTRIBUTED FEEDBACK SEMICONDUCTOR LASER

This is a continuation of application Ser. No. 410,431 filed Aug. 23, 1982, now abandoned.

BACKGROUND OF THE INVENTION

The present invention relates to a distributed feedback type semiconductor laser which is provided with a portion having periodic refractive index variations in the direction of light propagation in an active layer or a layer adjacent thereto and is caused to perform laser oscillation by injecting a current into the active layer portion.

The distributed feedback type semiconductor laser of this kind has, in an active layer or a layer adjacent thereto, a corrugation (a diffraction grating) providing periodic refractive index variations, and carries out a single wavelength operation, and hence possesses excellent characteristics as a light source for high quality optical fiber communication. Further, since the oscillation wavelength can also be adjusted as desired by changing the period of the corrugation in the fabrication process and since no cleaved planes are needed for a resonator unlike in conventional semiconductor lasers, this kind of semiconductor laser can also be applied as an integrated laser. However, if a lateral mode control mechanism is introduced into such a distributed feedback type semiconductor laser to reduce the stripe width down to about several $\mu m$, the resulting laser output power inevitably becomes small. The reduction of the output is a problem in recently proposed, lateral mode controlled semiconductor lasers in which the resonator is usually formed by cleaved planes and, at present, the semiconductor laser output power is limited to several mW. An increase in the semiconductor laser output is one of the requirements for lengthening the repeater spacing in communication systems. One method that has been employed to meet such a requirement is to operate the semiconductor laser with a high injection current, but this method introduces a problem in the reliability of the laser because the injected current density and the power density of light at the laser resonator facets become high.

SUMMARY OF THE INVENTION

In view of such defects, an object of the present invention is to provide a semiconductor laser which is composed of a distributed feedback type semiconductor laser and an injection region formed as a unitary structure therewith and having no periodic refractive index variations and which is able to produce a high output and a modulated output at a high extinction ratio.

In accordance with the present invention, there is proposed a distributed feedback type semiconductor laser, which is provided with a portion having periodic refractive index variations in the direction of light propagation in one of an active layer and a layer adjacent thereto and is caused to perform laser oscillation by injecting a current into the active layer portion, characterized in that a current injection region having no periodic refractive index variations is formed on an extension of the portion having the periodic refractive index variations.

BRIEF DESCRIPTION OF THE DRAWINGS

The present invention will be described in detail with reference to the accompanying drawings, in which.

DETAILED DESCRIPTION

Figure 1:
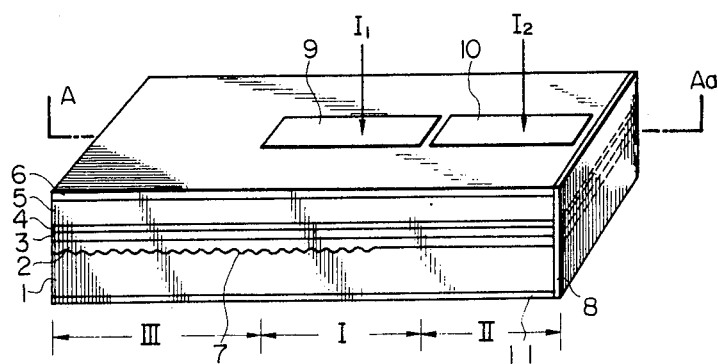
FIG. 1 is a perspective view illustrating an embodiment of the present invention.
Figure 2:
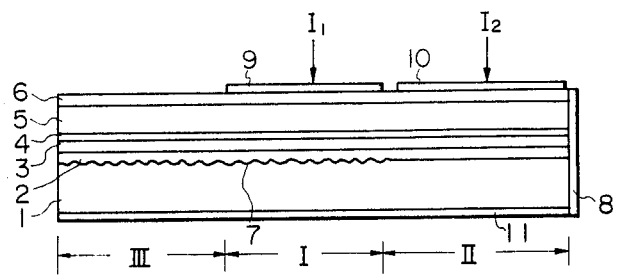
FIG. 2 is a sectional view taken on the line A-Aa in FIG. 1.

With reference to FIG. 1 of a perspective view showing an example of the arrangement of the present invention using a GaInAsP crystal, and FIG. 2 of a sectional view taken on the line A-Aa in FIG. 1, reference numeral 1 indicates an n type InP substrate; 2 designates a waveguide layer formed of n type $Ga_uIn_{1-u}As_vP_{1-v}$; 3 identifies an active layer formed of undoped $Ga_xIn_{1-x}As_yP_{1-y}$; 4 denotes a buffer layer formed of p type $Ga_pIn_{1-p}As_qP_{1-q}$; 5 represents a p type InP layer; and 6 shows a cap layer formed of p type GaInAsP. These semiconductor layers bear such relationships as $x > u$, p; $y > v$, q and they can be formed by liquid phase, vapor phase or molecular beam epitaxy. Reference numeral 7 refers to a corrugation which is formed on the substrate 1 for providing periodic variations in refractive index; and 8 signifies an anti-reflection coating film for preventing reflection from the end facet. A region I serves as a distrisuted feedback type semiconductor laser and forms a resonator, without cleaved planes, by the corrugation formed on the substrate 1 and, by injecting a current $I_1$ into an electrode 9, oscillation can be obtained. A region II is an injection region formed as a unitary structure with the distributed feedback type semiconductor laser and having no periodic refractive index variations, which is characteristic of the present invention. By injecting a current $I_2$ via an electrode 10 into the region II independently of the region I, a laser output yielded in the region I is amplified to produce a high output, which is emitted from the end facet 8. That is to say, the region II functions as an optical amplifier formed as a unitary structure with the semiconductor laser and, in addition, the regions I and II are directly coupled with each other; therefore, no coupling losses are caused in the output power at the interface between the regions I and II. Furthermore, since the laser output is absorbed in the region II and is not emitted from the end facet 8 unless no current is injected into the region II and it is emitted upon injection of the current $I_2$, a modulated output light of high extinction ratio can be obtained by modulating the current $I_2$. In other words, the region II can be equipped with the function of an optical modulator formed as a unitary structure with the semiconductor laser. A region III is a non-exciting region for preventing reflection from the other end facet. A portion of the output light from the distributed feedback type semiconductor laser is reflected back by the corrugation also formed in the region III to the region I, but the output light is mostly absorbed in the region III.

Figure 3:
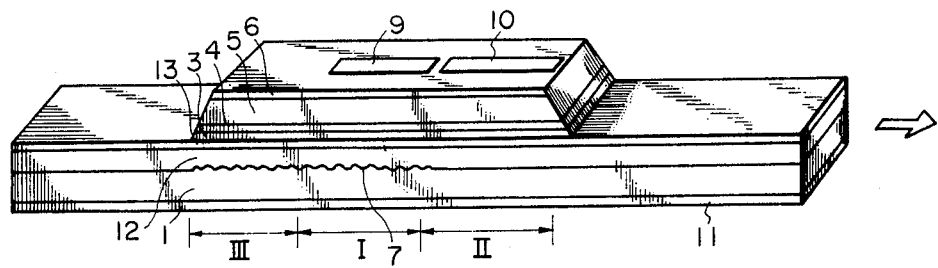
FIG. 3 is a perspective view showing another embodiment of the present invention as being applied to an integrated twin-guide structure.
Figure 4:
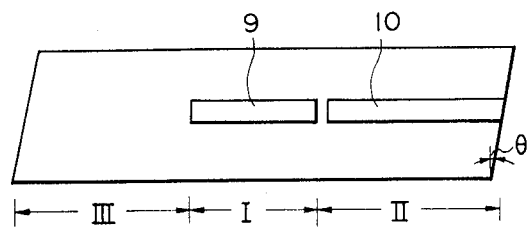
FIG. 4 is a top view showing another embodiment of the present invention as being applied to an element configuration in which an output end facet has a slight tilted angle with respect to a plane perpendicular to the direction of light propagation.

The same effect as is obtainable with the anti-reflection coating film for preventing reflection at the end facet can be produced by such a transmission type optical integrated circuit structure in which the output light is coupled with an output waveguide 12 as shown in FIG. 3 which exemplifies an integrated twin-guide structure in which the output waveguide 12 formed of $Ga_sIn_{1-s}As_tP_{1-t}(x>s, y>t)$ and an InP intermediate layer 13 are disposed adjacent to the active layer. Alternatively, such an effect can also be obtained by such a structure as illustrated in FIG. 4 in which the end facet of the region II has a slight tilted angle $\theta$ ($<16°$) with respect to a plane perpendicular to the direction of light propagation so that no resonator is formed.

Figure 5:
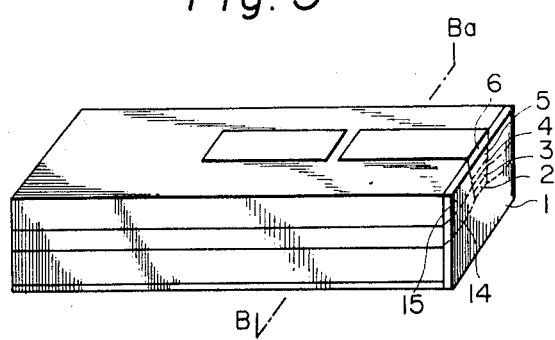
FIG. 5 is a perspective view illustrating another embodiment of the present invention as being applied to a buried hetero-structure.
Figure 6:
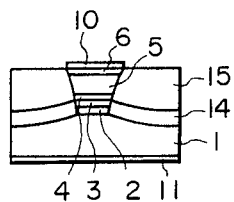
FIG. 6 is a sectional view taken on the line B-Ba in FIG. 5.

Although the corrugation is shown to be formed on the substrate 1, the same effect as described previously could be obtained even if the corrugation is disposed in any part where an optical field confined in the waveguide overlaps the corrugation. Moreover, an electrode stripe structure is shown as a specific example for the sake of simplicity, but the present invention can be adapted for a stripe structure which permits fabrication of the distributed feedback type semiconductor laser, such as a lateral mode controlled buried hetero-structure as depicted in FIG. 5 and FIG. 6 which is a sectional view taken on the line B-Ba in FIG. 5.

While in the foregoing embodiments the GaInAsP crystal system mixed crystal is employed, the present invention is possible with mixed crystals of other systems, such as AlGaAs system.

As has been described in detail in the foregoing, according to the present invention, the semiconductor laser yields not only a high output but also a modulated output of high extinction ratio without affecting its oscillation wavelength; hence, the semiconductor laser can be expected as a light source for high quality optical communications.

What we claim is:

1. A semiconductor laser of distributed feedback type, comprising:
   a laser region (I) having periodic refractive index variations in the direction of light propagation in an active layer (3) and a layer (2,12) adjacent thereto and having an electrode for injection of a current for causing laser oscillation by injecting the current into the active layer,
   a current injection region (II) defining at one side of the laser region (I) a waveguide layer (2) with no periodic refractive index variations provided along an extension of the periodic refractive index variations as a unitary extension of each of corresponding layers and of same compositions thereof for amplifying or modulating output light from the laser region (I) by current injection from another electrode, and
   a non-exciting region (III) provided at the other side of the laser region (I) along another extension of the periodic refractive index variations as a unitary extension of each of corresponding layers but free of electrodes and of same compositions thereof for preventing light reflection from the other end facet of the semiconductor laser thereby to cause stable laser oscillation of single wavelength in the laser region (I).

2. A semiconductor according to claim 1, in which an anti-reflection coating film is provided at the end facet of the current injection region for preventing reflection from the end facet for obtaining said laser oscillation as an output.

3. A semiconductor laser according to claim 1, in which an end facet of the current injection region has a slight tilted angle with respect to a plane perpendicular to the direction of light propagation from the active layer.

4. A semiconductor laser according to claim 1, in which an output waveguide of integrated twin-guide structure is disposed adjacent to the active layer.

* * * * *